(12) United States Patent
Kraemer et al.

(10) Patent No.: US 12,267,985 B2
(45) Date of Patent: Apr. 1, 2025

(54) METHOD FOR CONTROLLING A VENTING SYSTEM

(71) Applicant: Robert Bosch GmbH, Stuttgart (DE)

(72) Inventors: Florian Kraemer, Pfedelbach (DE); Rainer Schittenhelm, Ilvesheim (DE); Robert Kornhaas, Spraitbach (DE); Ulrich Kersken, Diekholzen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 383 days.

(21) Appl. No.: 17/837,172

(22) Filed: Jun. 10, 2022

(65) Prior Publication Data

US 2022/0408591 A1      Dec. 22, 2022

(30) Foreign Application Priority Data

Jun. 16, 2021   (DE) .................... 10 2021 206 167.2

(51) Int. Cl.
*H05K 7/00*        (2006.01)
*H05K 7/20*        (2006.01)

(52) U.S. Cl.
CPC ..... *H05K 7/20209* (2013.01); *H05K 7/20172* (2013.01); *H05K 7/20009* (2013.01)

(58) Field of Classification Search
CPC ........... H05K 7/20209; H05K 7/20172; H05K 7/20009
See application file for complete search history.

(56) References Cited

U.S. PATENT DOCUMENTS

2007/0089859 A1*   4/2007   Wei ...................... H01L 23/473
                                                        257/E23.098
2008/0257639 A1*   10/2008  Yamaguchi ........ H05K 7/20736
                                                        181/198
2019/0116688 A1*   4/2019   Chu ....................... G06F 1/203

OTHER PUBLICATIONS

CN 112996343 A; published in Jun. 18, 2021 (Year: 2021).*
DE 102019134828 A1 English Translation (Year: 2019).*

* cited by examiner

*Primary Examiner* — Pete T Lee
(74) *Attorney, Agent, or Firm* — NORTON ROSE FULBRIGHT US LLP; Gerard A. Messina

(57) ABSTRACT

A method for controlling a venting system, in particular a venting system for cooling electronic control devices. The venting system has a first ventilator and a second ventilator. The first ventilator is controlled via a first channel and the second ventilator is controlled via a second channel. The two ventilators are mechanically independent of each other and controlled separately from each other.

15 Claims, 2 Drawing Sheets

METHOD FOR CONTROLLING A VENTING SYSTEM

CROSS REFERENCE

The present application claims the benefit under 35 U.S.C. § 119 of German Patent Application No. 10 2021 206 167.2 filed on Jun. 16, 2021, which is expressly incorporated therein by reference.

FIELD

The present invention relates to a method for controlling a venting system, in particular a venting system for cooling electronic control devices, and to a system for carrying out the method.

BACKGROUND INFORMATION

Highly automated vehicles require fault-tolerant systems that transfer the vehicle to a safe state even in the event of an error. One important component of fault-tolerant systems is the most fail-safe cooling of the system, which means that the remaining cooling capacity in the event of an error in the cooling system is sufficient to prevent the system from abruptly shutting down and thereby causing a risk to the vehicle.

SUMMARY

A method and a system for controlling a venting system are provided. Example embodiments of the present invention are disclosed herein.

The method in accordance with the present invention is used for controlling a venting system, in particular for cooling electronic control devices, the venting system having a first ventilator and a second ventilator. In accordance with an example embodiment of the present invention, the first ventilator is controlled via a first channel and the second ventilator is controlled via a second channel, the two ventilators being mechanically independent of each other and being controlled separately from each other.

The statement that the ventilators are mechanically independent of each other means that they are structurally separate and typically disposed at a distance from each other. In other words, the ventilators do not jointly use any mechanical components.

The system of the present invention is used for carrying out the described method and implemented in a hardware and/or software, for example. In addition, the system may be integrated into a control device of a motor vehicle or be developed as such.

The method and the system of the present invention are able to be used in a fault-tolerant, active cooling system, which in turn may be used in highly automated vehicles, in particular. The venting system and the cooling system including this venting system are also meant to constitute a subject of the present invention.

Thus, a design of a fault-tolerant, active cooling system having redundant ventilators and control is enabled. A redundant control and in particular a mechanical redundancy are provided.

The method and the system of the present invention have a number of advantages in at least a few of the embodiments:
high availability,
cooling is still provided in case of (simple) errors, whether mechanical or electrical,
an adaptation to different ventilation loads by switching between two channels.

Additional advantages and refinements of the present invention result from the description herein and the figures.

It is understood that the aforementioned features and the features still to be described in the following text may be used not only in the combination indicated in each case but also in other combinations or on their own without departing from the scope of the present invention.

DETAILED DESCRIPTION OF EXAMPLE EMBODIMENTS

The present invention is schematically shown in the figures with the aid of embodiments and will be described in greater detail in the following text with reference to the figures.

Figure 1:
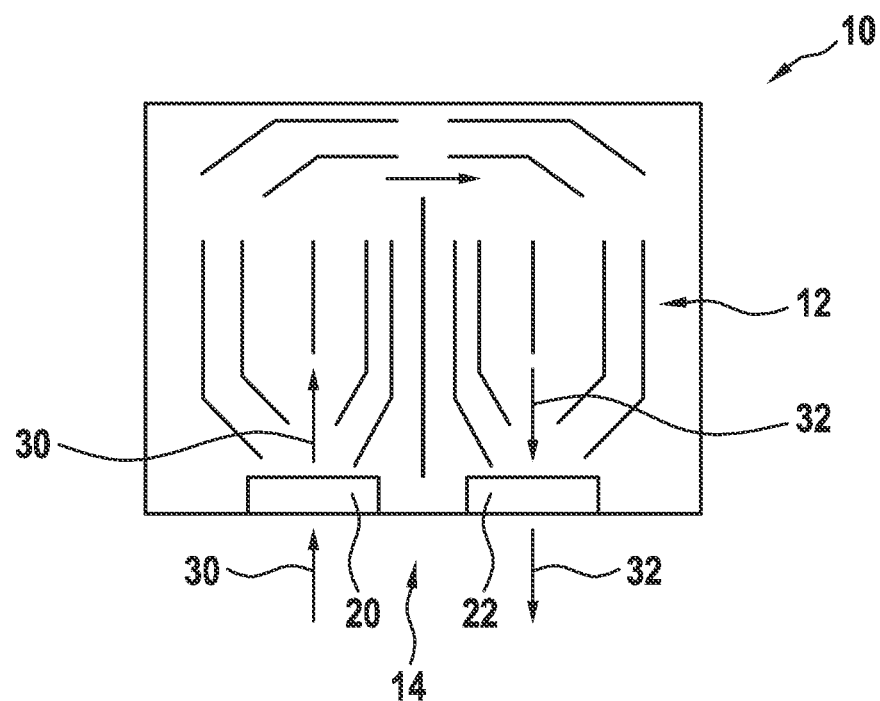
FIG. 1 shows a schematic illustration of a cooling system in a top view, in accordance with an example embodiment of the present invention.

FIG. 1 shows a top view of a cooling system 10, which has a cooling structure 12 and is coupled with an active venting system 14. Venting system 14 includes a first ventilator 20 and a second ventilator 22, which are mechanically independent of each other and able to be controlled separately from each other.

Active venting system 12 thus is made up of a cooling channel provided with two mechanically independent ventilators 20, 22 and their redundant controls via a first channel and a second channel. First ventilator 20 pushes cold air (arrows 30) into cooling structure 12, and second ventilator 22 sucks warm air (arrows 32) out of cooling structure 12.

Figure 2:
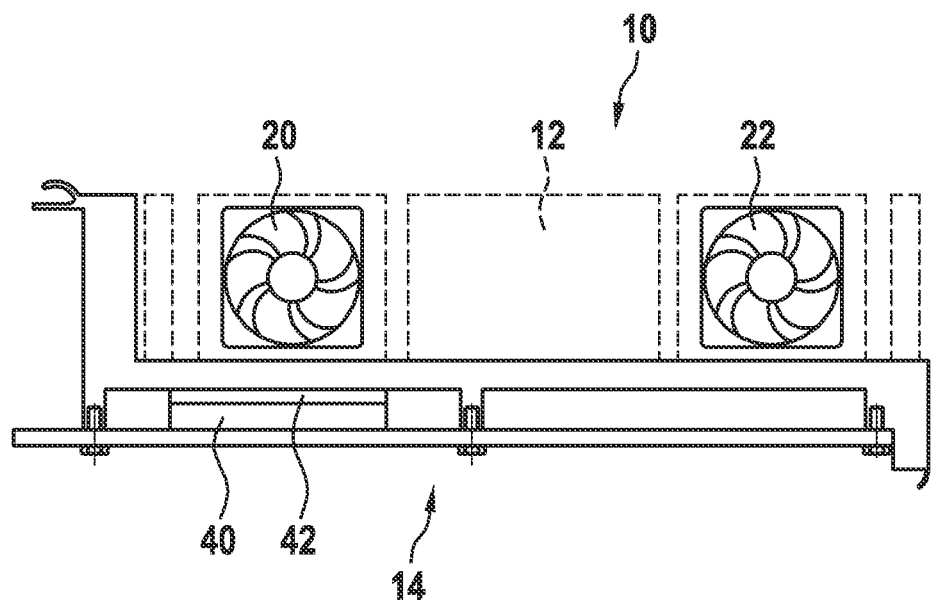
FIG. 2 shows the cooling system from FIG. 1 in a side view.

Cooling system 10 is shown in a side view in FIG. 2. The illustration shows cooling structure 12 and also first ventilator 20 and second ventilator 22 of venting system 14.

By way of example, reference numeral 40 denotes an electrical component to be cooled in the circuit. Reference numeral 42 shows a heat-coupling element from component 40 into cooling system 10.

Figure 3:
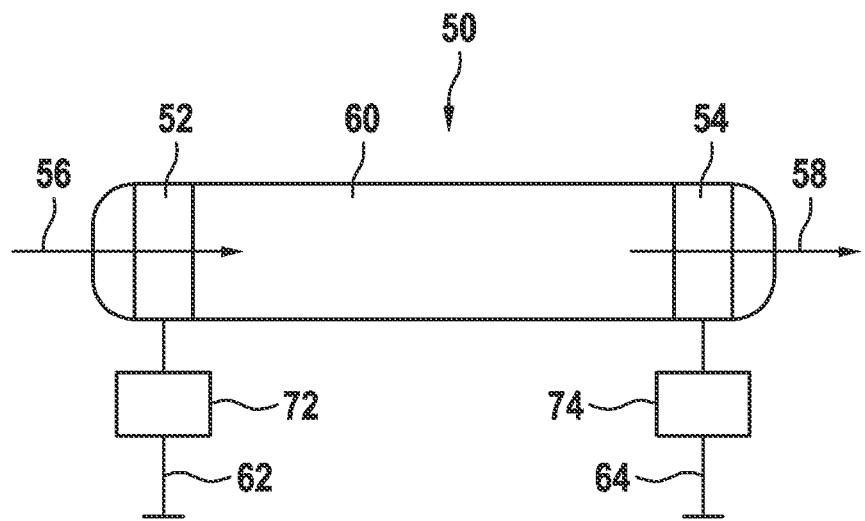
FIG. 3 shows a functional illustration of the described venting system, in accordance with an example embodiment of the present invention.

FIG. 3 shows a schematic representation of venting system 50, which includes a first ventilator 52 and a second ventilator 54. These ventilators 52 and 54 push air into or suck air out of cooling structure 60 (arrows 56 and 58).

A first channel 62 having a first control 72 is allocated to first ventilator 52. Accordingly, a second channel 64 having a second control 74 is allocated to second ventilator 54. The two controls 72, 74 are able to be operated independently of each other.

The configuration of the control(s) 72, 74 is designed in such a way that four operating modes are able to be realized:
Variant A:

| Operating Modes | Channel 1 | Channel 2 | Cooling Capacity |
|---|---|---|---|
| #1 | off | off | 0% |
| #2 | on | off or error | 34% |

-continued

| Operating Modes | Channel 1 | Channel 2 | Cooling Capacity |
|---|---|---|---|
| #3 | off or error | on | 66% |
| #4 | on | on | 100% |

The thermal operating behavior must be configured in such a way that at a 34% cooling output, the system is still able to be brought to a safe state within a certain time.

Variant B:

| Operating Modes | Channel 1 | Channel 2 | Cooling Capacity |
|---|---|---|---|
| #1 | off | off | 0% |
| #2 | on | off or error | 50% |
| #3 | off or error | on | 100% |
| #4 | on | on | 150% |

The indicated percentages relate to the maximum nominal capacity of the ventilators, a brief increase being possible.

The different cooling outputs in the second and in the third operating modes result from the different capacities of the two ventilators.

The thermal operating behavior must be configured in such a way that at a 50% cooling output, the system is still able to be brought to a safe state within a certain time. In addition, this system offers the advantage that certain thermal peaks by a cooling output of up to 150% are better able to be absorbed.

The introduced method may basically be used in all fault-tolerant and actively cooled systems.

What is claimed is:

1. A method for controlling a venting system for cooling electronic control devices, the venting system including a first ventilator and a second ventilator, the method comprising the following steps:
controlling the first ventilator via a first channel; and
controlling the second ventilator via a second channel;
wherein the first and second ventilators are mechanically independent of each other and are controlled separately from each other such that, in a first operating mode, the first ventilator is switched on via the first channel, with the second ventilator being off.

2. The method as recited in claim 1, wherein the first ventilator is configured to push air into a cooling structure, and the second ventilator is configured to suck air out of the cooling structure.

3. The method as recited in claim 1, wherein, in a second operating mode, the first ventilator and the second ventilator are controlled via the first and second channels to be switched off.

4. The method as recited in claim 2, wherein, in the first operating mode, the venting system is controlled in such a way that a cooling output of 34% is provided.

5. The method as recited in claim 2, wherein, in the first operating mode, the venting system is controlled in such a way that a cooling output of 50% is provided.

6. The method as recited in claim 1, wherein, the first ventilator is configured to suck air out of the cooling structure and the second ventilator is configured to push air into a cooling structure.

7. The method as recited in claim 6, wherein, in the first operating mode, the venting system is controlled in such a way that a cooling output of 66% is provided.

8. The method as recited in claim 6, wherein, in the first operating mode, the venting system is controlled in such a way that a cooling output of 100% is provided.

9. The method as recited in claim 1, wherein, in a second operating mode, the first and second channels are used so that the first and second ventilators are both switched on.

10. The method as recited in claim 9, wherein, in the second operating mode, the venting system is controlled in such a way that a cooling output of 100% is provided.

11. The method as recited in claim 9, wherein, in the second operating mode, the venting system is controlled in such a way that a cooling output of 150% is provided.

12. A system configured to control a venting system for cooling electronic control devices, the venting system including a first ventilator and a second ventilator, the system comprising:
a processor programmed to:
control the first ventilator via a first channel; and
control the second ventilator via a second channel;
wherein the first and second ventilators are mechanically independent of each other and are controlled separately from each other such that, in a first operating mode, the first ventilator is switched on via the first channel, with the second ventilator being off.

13. The system as recited in claim 12, wherein the first ventilator is configured to push air into a cooling structure, and the second ventilator is configured to suck air out of the cooling structure.

14. The method as recited in claim 4, wherein the first and second channels are controlled so that:
in a second operating mode, the first and second ventilators are both off so that the venting system provides cooling output of 0%;
in a third operating mode, the first and second ventilators are both on so that the venting system provides cooling output of 100%; and
in a fourth operating mode, the first ventilator is off and the second ventilator is on so that the venting system provides cooling of 66%.

15. The method as recited in claim 4, wherein the first and second channels are controlled so that:
in a second operating mode, the first and second ventilators are both off so that the venting system provides cooling output of 0%;
in a third operating mode, the first and second ventilators are both on so that the venting system provides cooling output of 150%; and
in a fourth operating mode, the first ventilator is off and the second ventilator is on so that the venting system provides cooling of 100%.

* * * * *